United States Patent [19]

Riley

[11] 3,824,490

[45] July 16, 1974

[54] NEGATIVE RESISTANCE DEVICES

[75] Inventor: Terence James Riley, Warren, N.J.

[73] Assignee: Bell Telephone Laboratories, Incorporated, Murray Hill, Berkeley Heights, N.J.

[22] Filed: June 29, 1973

[21] Appl. No.: 374,958

[52] U.S. Cl.. 331/107 R, 317/235 K, 317/235 AD, 317/235 AK, 317/235 AM

[51] Int. Cl. .......... H03b 7/00

[58] Field of Search331/107 R; 317/235 K, 235 AD, 317/235 AM, 235 AK

[56] References Cited

UNITED STATES PATENTS 3,673,514 6/1972 Coleman, Jr. .......... 331/107

*Primary Examiner*—John Kominski

*Attorney, Agent, or Firm*—R. B. Anderson

[57] ABSTRACT

The efficiency of negative resistance devices of the type now known as BARITT devices is increased by reducing the effect of the positive resistance portion of each current transit cycle. In one embodiment, a control electrode near the injecting contact is connected through a phase delay to the r-f resonator to delay the injection of minority carriers so that a larger portion of carrier transit occurs during the negative resistance cycle portion. In another embodiment, a control electrode near the injecting contact capacitively couples RF energy from the injected carriers to the injecting contact during the positive resistance portion of the cycle.

10 Claims, 10 Drawing Figures

NEGATIVE RESISTANCE DEVICES

BACKGROUND OF THE INVENTION

This invention relates to negative resistance devices, and more particularly to devices of the type now generally known as BARITT devices.

One form of microwave frequency negative resistance device, known as the IMPATT diode, an acronym for IMPact ionization And Transit Time, is described, for example, in the U.S. patent of B. C. De Loach, Jr. et al. U.S. Pat. No. 3,270,293, assigned to Bell Telephone Laboratories, Incorporated and the paper "The IMPATT Diode — A Solid-State Microwave Generator," *Bell Laboratories Record*, K. D. Smith, Vol. 45, 1967, p. 144. In an IMPATT diode oscillator, an applied directcurrent bias voltage, in conjunction with a resonant circuit, periodically biases a p-n junction to avalanche breakdown, thereby creating current pulses, each of which travels across a transit region within a prescribed time period. This transit time is arranged with respect to the resonant frequency of the resonator such that r-f voltages at the diode terminals are out-of-phase with the current pulses in a diode. The current through the circuit therefore increases as the voltage across the terminals decreases, giving rise to a negative resistance. An analogous device operating on the same general principle is described in the U.S. patent of Read, U.S. Pat. No. 2,899,652, assigned to Bell Telephone Laboratories, Incorporated.

As compared to other solid-state microwave sources, the IMPATT diode is rather noisy. Generated noise can be reduced by increasing the figure of merit Q of the microwave resonator, but this in turn undesirably reduces efficiency. Despite these inherent compromises, the IMPATT diode is presently considered to be generally superior to competitive solid-state microwave sources such as the tunnel diode, Gunn-effect diode, and the microwave transistor.

A device that operates in a manner comparable to the IMPATT diode, but which has better noise characteristics, is described in the U.S. patent of Coleman et al. U.S. Pat. No. 3,673,514, assigned to Bell Telephone Laboratories, Incorporated, and is now generally known as the BARITT device, an acronym for BARrier Injection and Transit Time. Like the IMPATT device, the BARITT device comprises a transit region contained between two rectifying junctions, but instead of current carriers being generated at one of the junctions by an avalanche breakdown, they are generated at one of the junctions by minority carrier injection. It can be shown that this mechanism is inherently less noisy than the avalanche mechanism required in IMPATT devices.

However, as is clear from the Coleman et al. patent, the current pulse contributes to the device negative resistance during only about two-thirds of the current transit time; during the remaining one-third of the transit time, the current contributes a positive resistance. This inherently limits the efficiency of the BARITT device, which of course may be a serious drawback, particularly if the device is being used as a microwave source.

SUMMARY OF THE INVENTION

Accordingly, it is an object of this invention to improve the efficiency of devices of the type now generally known as BARITT devices.

This and other objects of the invention are attained in illustrative embodiments thereof of the type briefly described in the Astract of the Disclosure.

In the phase delay embodiment, a control electrode near the injecting electrode is connected through a phase delay to the r-f resonator. The phase delay may, for example, be 90°, such that the maximum amplitude on the control electrode lags the maximum voltage across the device by 90°. This has the effect of delaying the time at which a maximum electric field is concentrated at the injecting electrode, thereby delaying the time at which minority carriers are injected into the transit region. Because of this delayed injection, a greater part of the current transit occurs during the negative resistance portion of the r-f cycle, thus increasing device efficiency.

In the capacitive coupling embodiment, the control electrode effectively screens the drain contact from the injected carriers during all or part of the positive resistance portion of the current transit. Thus, injection occurs at the same time as in the known BARITT device, but the effect of the positive resistance portion is reduced by causing the carriers to couple capacitively to the control electrode rather than to the collector electrode during the positive resistance portion.

Both of the foregoing embodiments require the control electrode to be physically small and physically close to the injecting electrode if the device is to be operated at high microwave frequencies. As will become clear hereinafter, the mesa shadow mask technique described in the application of B. R. Pruniaux, Ser. No. 136,851, filed Apr. 23, 1971, and assigned to Bell Telephone Laboratories, Incorporated, is admirably suited to making the required control electrode with accurate registration.

These and other objects, features and advantages of the invention will be better understood from the consideration of the following detailed description taken in conjunction with the accompanying drawing.

DRAWING DESCRIPTION

DETAILED DESCRIPTION

Figure 1:
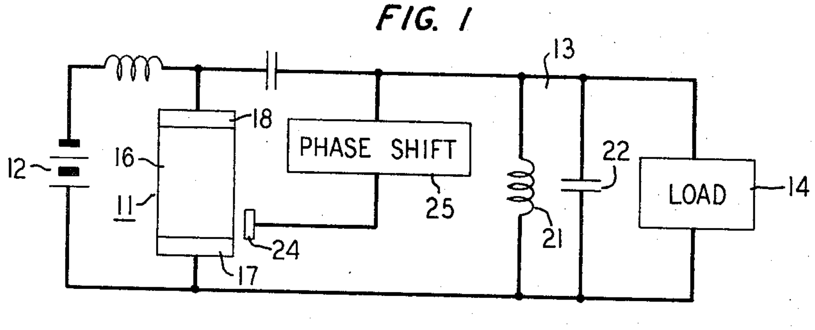
FIG. 1 is a schematic circuit diagram of a negative resistance oscillator in accordance with an illustrative embodiment of the invention.

Referring now to FIG. 1, there is shown an oscillator circuit in accordance with an illustrative embodiment of the invention comprising a negative resistance device 11 biased by a d-c source 12 and contained within a circuit comprising a resonator 13 and a load 14. The negative resistance device 11 comprises a semiconductor wafer 16 contained between opposite contacts 17 and 18. The resonator 13 is shown schematically as comprising an inductance 21 and a capacitance 22, although in practice, resonator 13 would be a microwave cavity resonator, of any of various known structures.

Negative resistance device 11 is an improved BARITT device in which contact 17 is the injecting contact and contact 18 is the collecting contact. In accordance with the invention, a control electrode 24 is included near the injecting contact 18 for controlling the electric field in wafer 16 in the region of injecting contact 18. Control electrode 24 is connected to the resonator 13 through a phase shifter 25, which, for example, may shift the phase of voltage applied to control electrode 24 by 90°. Before discussing the effect of the inventive improvements, it would perhaps be desirable to review the operation of device 11 as it would operate without the invention; that is, if it operated entirely as is described, for example, in the aforementioned Coleman et al. patent.

Figure 2A:
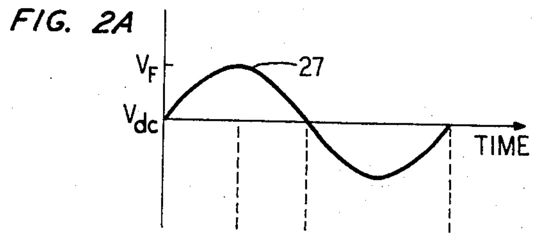
FIGS. 2A and 2B are graphs of voltage and current distribution, respectively, in a BARITT device of the prior art.

The manner in which the conventional BARITT device of the prior art develops a negative resistance for the generation of microwave energy is depicted in the graphs of FIG. 2 in which curve 27 represents applied voltage across wafer 16 and curve 28 represents terminal current with respect to time. In accordance with the known BARITT mechanism, substantially no current flows through the semiconductor wafer until the voltage approaches a threshold value $V_{FB}$, which triggers a pulse of current in the wafer. The length of the transit region of wafer 16 is tailored with respect to carrier velocity such that the transit angle is approximately $(3\pi/2)$ radians; that is, the time taken for a current pulse to traverse the device wafer is approximately three-fourths of a period of the r-f frequency component. As a result, current flows through the circuit during the negative portion of the voltage cycle in opposition to the voltage, thereby establishing a negative resistance. Thus, the shaded portion of curve 28 indicates negative resistance, while the remaining unshaded portion of the curve, in which currents and voltages are in phase, represent positive resistance; it can be appreciated that with an appropriate transit angle, a substantial net negative resistance is attained in the conventional BARITT diode of the prior art.

As is known, a BARITT device must have at least two rectifying junctions, one of which is forward-biased and is the injecting barrier, the other being reverse-biased. The active region of the wafer must be thin enough to give voltage reach-through prior to avalanche breakdown. That is, the voltage gradient resulting from the applied bias must extend the entire distance between the forward-biased and the reverse-biased junctions and this voltage must never exceed the avalanche threshold. The flat-band voltage of the wafer at the forward-biased junction must in general be lower than the breakdown voltage. The flat-band voltage is indicated on FIG. 2A by $V_{FB}$ and, as is described more fully in the Coleman et al. patent, is the voltage which results in a zero electric field at the forward-biased junction. Copious minority carrier injection requires in general that the minority carrier barrier be smaller than half the energy gap between the conduction and valence bands of the semiconductor.

As mentioned before, the known BARITT device has the advantage of being capable of generating relatively low-noise oscillations, but has the disadvantage of having a relatively low efficiency. The efficiency is limited by the positive resistance of the device during a significant portion of the current transit as indicated by the unshaded portion of curve 28.

Figure 3:
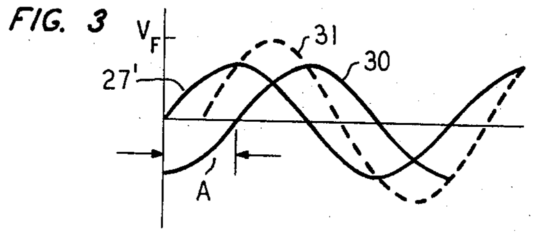
FIG. 3 is a graph showing the voltage on the control electrode of the device of FIG. 1 in relation to the voltage applied between the injecting and collector contacts.

In accordance with the invention, phase shifter 25 and control electrode 24 cooperate to delay the injection of minority carriers into the transit region of wafer 16 so as to increase the proportion of the carrier transit time during which a negative resistance is generated. Referring to FIG. 3, consider waveform 27′ to represent the applied voltage across wafer 16 as in FIG. 2A, and waveform 30 to be the voltage applied by control electrode 24, which lags waveform 27′ by an angle A determined by phase shifter 28. The total voltage at the injecting junction is roughly the sum of the two waveforms as designated by curve 31 (for equal capacitive coupling of the control and collecting electrodes to the injecting electrode). If the threshold voltage $V_F$ is higher than the maximum voltage of curve 27′, then injection is controlled by curve 31 as shown.

Figure 2B:
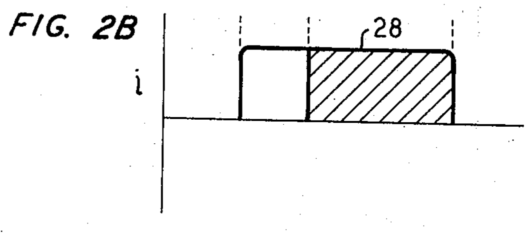

In the example shown, the voltage of waveform 30 lags that of 27′ by 90°, giving a maximum of waveform 31 which lags the maximum of curve 27′ by 45°. Referring to FIG. 2B it can be appreciated that if injection is delayed by 45°, then the area of the unshaded portion of curve 28 is reduced by one-half, thus reducing the generated positive resistance by one-half. Delayed injection thereby increases the efficiency by increasing the ratio of the negative resistance portion of current transit to the positive resistance portion.

The phase shift of 90° applied by phase shifter 25 is given only for purposes of illustration. Any phase delay provided by the invention will delay minority carrier injection thereby to improve efficiency. Referring to FIG. 2, maximum efficiency improvement would theoretically be obtained by delaying injection by 90°. This effect can be achieved by making the control electrode capacitively coupled to the injecting contact much more strongly than the collector electrode with the result that the electric field is predominantly determined by the voltage on the control electrode.

Figure 4:
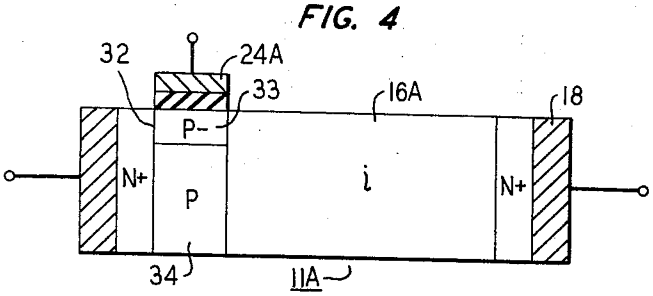
FIG. 4 is a schematic diagram of an improved negative resistance device in accordance with an illustrative embodiment of the invention.

FIG. 4 illustrates the structure of a negative resistance device 11A which may be used in the circuit of FIG. 1; it comprises a control electrode 24A, an injecting barrier 32 and a transit region 16A. The semiconductor region adjacent control electrode 24A comprises a relatively lightly doped central region 33 and a more heavily doped high conductivity region 34. The purpose of the high conductivity region 34 is to restrict and confine the electric field to the control region. Thus, electric field lines from contact 18 extend through transit region 16A and through control region 33 rather than through region 34. This gives voltage reach-through in region 33 but no such reach-through in region 34 because electric field lines are terminated by the relatively larger impurity concentration in region 34. This structure makes possible the control of carrier injection at p-n junction 32 by control electrode 24A in the manner described previously.

The criteria for minority carrier injection have been discussed previously in general and are described in detail in the Coleman et al. patent. The generation of the required voltage by control electrode 24A (waveform 30 of FIG. 3) would have to take into account fringing fields, capacitive coupling, etc., all of which are design considerations. The various dimensions, conductivities and other relevant parameters are readily ascertainable by those skilled in the art.

Figure 5:
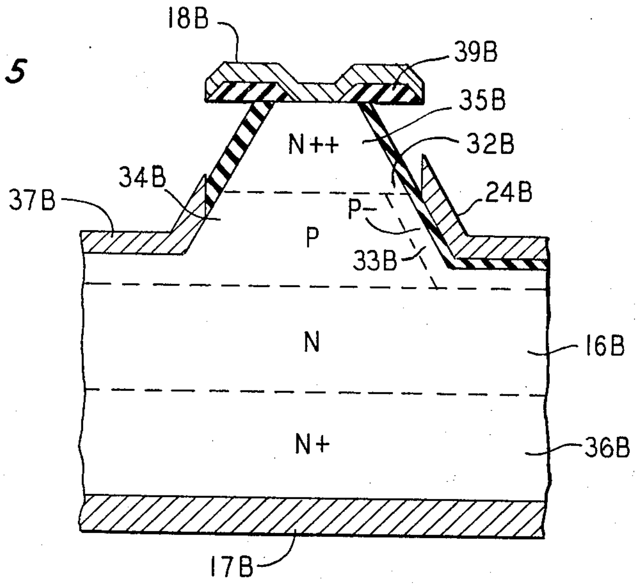
FIG. 5 is a schematic view of an alternative structure to that shown in FIG. 4.

In arriving at suitable designs for microwave frequency applications, it becomes apparent that the control electrode 24A must be physically short and that some effort must be made to give selective voltage reach-through for proper carrier injection control in accordance with the invention. In solving practical problems of design and fabrication, good use may be made of the mesa shadow mask technique described in the copending application of B. R. Pruniaux, Ser. No. 136,851, filed Apr. 23, 1971 and assigned to Bell Telephone Laboratories, Incorporated. FIG. 5 illustrates one example of how the teachings of this application may be used for constructing a device which operates in the same general manner as the FIG. 4 device. The FIG. 5 apparatus comprises an injection layer 35B, a relatively high conductivity *p* layer 34B, a transmit layer 16B and a collector layer 36B. Minority carriers are injected at junction 32B and their injection is controlled by a control electrode 24B.

A control layer 33B may either be formed electrically by providing an appropriate reverse-bias voltage to control electrode 24B to give layer 33B the equivalent of a high-resistivity p-conductivity as shown or metallurgically by a shadow masked ion implantation procedure. An additional electrode 37B is provided to apply a bias voltage to layer 34B so as to further control the shape of the control layer in an analogous manner to the substrate bias contact of a conventional planar IGFET device. Electrode 37B is not essential but is merely convenient for restricting the carrier injection to the control region as described before.

As in the aforementioned Pruniaux et al. application, electrodes 24B and 37B may be formed with great accuracy through the use of an oxide shadow mask 39B which is made by anisotropic etch undercutting. As described in that case, the lengths of electrodes 32B and 37B are limited by the thickness of layer 34B. Thus, small dimensions and accuracy of registration are both achieved.

While it is usually important that control region 33B be physically short, its length may be significant with respect to carrier transit time. Thus, in addition to the injection delay provided by the phase shifter, there is a further "injection delay" provided by the transit time of carriers along control region 33B. Thus, in FIG. 3, the actual delay may be somewhat more than the 45 degrees illustrated and may approach the optimum 90°.

As an example of various parameters that may be used in the embodiment of FIG. 5, the conductivities of layers 35B, 34B, 16B and 36B may be respectively $10^{20}$, $10^{17}$, $10^{15}$, and $10^{19}$ carriers per cubic centimeter. The d-c voltages on contacts 17B, 18B, 37B and 24B may respectively be +20, 0, 0 and +10 volts. The frequency of operation may be 10 gigahertz with the thicknesses of layers 35B, 34B, 16B and 36B being respectively ½, ½, 5 and 50 micrometers. With a typical flat-band voltage $V_F$ of 20 volts, the r-f voltage applied to control elecrode 24B may be 7 r.m.s. volts with an electrode insulation thickness of 0.2 micrometers. If desired, the control electrode 24B may form a Schottky barrier with the semiconductor rather than being insulated from it.

Besides the advantages enumerated above, it can be shown that the devices of FIGS. 4 and 5 have an extremely high transconductance and a high frequency capability. They are thus quite suitable for use as microwave amplifiers and high-speed logic elements.

Figure 6:
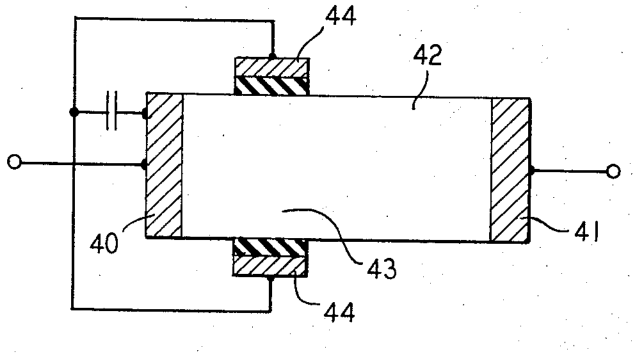
FIG. 6 is a schematic view of a negative resistance device in accordance with another embodiment of the invention.

The embodiment of FIG. 6 shows how the transit delay of carriers through a control region may provide all of the necessary delay needed for improving efficiency. The FIG. 6 device comprises an injecting electrode 40, a collecting electrode 41, a transit region 42 and a control region 43 defined by a control electrode 44 that surrounds the semiconductor. The device operates as a conventional BARITT device; that is, injection from contact 40 is controlled entirely by the electric field extending between contacts 40 and 41. However, as the carriers drift through control region 43, they are capacitively coupled to control electrode 44, rather than collector electrode 41. Thus, during an initial portion of their transit to the extent that they are not coupled to the output collector contact, they do not contribute to the positive resistance of the device. Referring to FIG. 2B, if the transit time of carriers in control region 43 is equal to $\pi/2$ radians, and if there is no induced output current *i* during this cycle portion, then the positive resistance represented by the unshaded portion of curve 28 is effectively eliminated.

As shown, the control electrode 44 should be capacitively coupled to the injecting contact 40 to give r-f voltage screening from contact 41. As with the previous embodiment, voltage reach-through between contacts 40 and 41 is required for current injection. Proper dimensions and electrical parameters for providing r-f screening by control electrode 44 during the initial portion of the current transit involve design considerations within the ordinary skill of a worker in the art.

Figure 7:
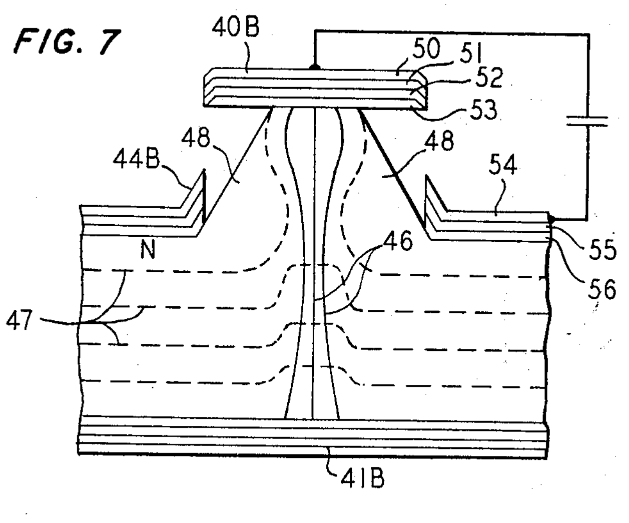
FIG. 7 is a schematic view of a negative resistance device having a structure which is an alternative of that shown in FIG. 6.

A practical embodiment is illustrated in FIG. 7 in which the anisotropic etch undercutting technique is used to form a mesa structure as was described before. The device comprises an injecting contact 40B, a collector contact 41B and a control electrode 44B which is capacitively conducted to the injecting contact. Electric field distribution at injection is illustrated by electric field lines 46 and equipotential lines 47. As shown, there is voltage reach-through simultaneously with the creation of a depletion region 48 adjacent the control electrode 44B. The injecting contact may advantageously comprise successive layers 50, 51, 52 and 53 of gold, platinum, titanium and platinum-silicide, respectively. As is known, this combination of metals will provide a good Schottky barrier contact to the n-type semiconductor. The control electrode on the other hand comprises successive layers 54, 55 and 56 of gold, platinum and titanium, respectively. Since titanium creates a higher Schottky barrier with silicon than does platinum-silicide, the barrier height of the injecting contact is lower than that of the control electrode. Thus, the device may be designed to provide selective minority carrier injection from the injecting contact to the exclusion of any minority carrier injection from the control electrode. The collector contact 41B may be made of the same materials as the injecting contact.

Figure 8:
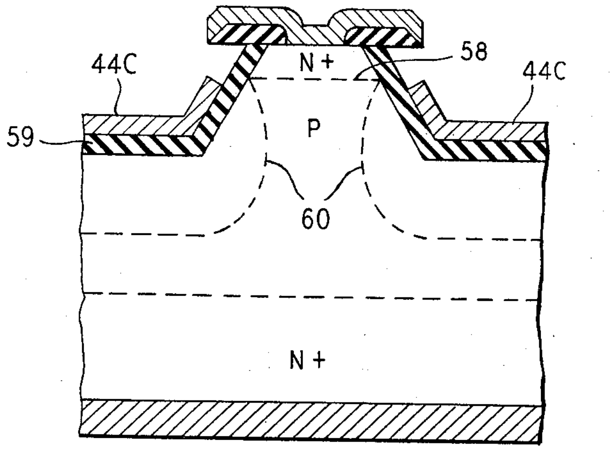
FIG. 8 is a schematic view of still another negative resistance device structure which is an alternative to that shown in FIG. 6.

An alternative embodiment is shown in FIG. 8 which operates in the same manner as FIG. 7 except that injection is from a p-n junction 58 and the control electrode 44C is separated from the semiconductor by an insulative layer 59. The electrode 44C may be reverse-biased to form a depletion layer within the semiconductor having boundaries 60. The depletion layer thus restricts minority carrier (in this case electron) flow to a region coincident with the central axis of the mesa.

Figure 9:
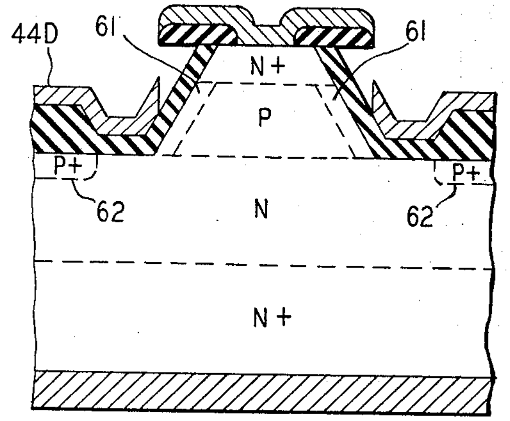
FIG. 9 is a schematic view of a negative resistance device structure in accordance with still another embodiment of the invention.

Another alternative is shown in FIG. 9 which is similar to FIG. 8 except that the control electrode 44D is reverse-biased so as to give an inversion layer 61 along the outer periphery of the mesa. The inversion layer tends to keep the injected carriers physically close to the control electrode 44D, thereby increasing capacitive coupling during the initial transit portion to increase efficiency.

Referring again to FIG. 2B, it should be pointed out that it is not necessary to eliminate completely the unshaded portion of curve 28 to improve efficiency. Any reduction in the unshaded portion of the curve will improve efficiency; thus even slight screening by the control electrode will reduce the positive resistance to improve efficiency. The embodiment of FIG. 9 is somewhat more efficient than that of FIG. 8 because the screening is more efficient.

Various other features may be employed to further increase the efficiency of the devices described thus far. For example, an ion implanted region along the mesa surface of the FIG. 8 embodiment may be employed to reduce the thickness of the depletion layer 60 thereby to increase the coupling effect of the control electrode 44C. In FIG. 9 ion implanted regions 62 may be employed to prevent the formation of unwanted inversion layers which may interfere with the transmission of carriers to the collector contact. The injecting and collecting junctions, as is known, may either be p-n junctions or Schottky barrier contacts; and the term "rectifying junction" as used herein is intended to embrace both terms.

The various embodiments that have been presented are to be considered to be merely illustrative. Various other embodiments and modifications may be made by those skilled in the art without departing from the spirit and scope of the invention.

What is claimed is:

1. In a BARITT device of the type comprising a semiconductor body contained between first and second contacts and including first and second rectifying junctions, the body being sufficiently thin that both the flat-band voltage and the reach-through voltage between the two rectifying junctions are smaller than the avalanche breakdown voltage, means for forward-biasing the first rectifying junction to a value between the reach-through voltage and the flat-band voltage, the minority carrier barrier of said forward-biased junction being sufficiently small to permit diode conduction by copious minority carrier injection, the improvement comprising:

a control electrode in the semiconductor body in proximity to the first rectifying junction;

and means for comprising the control electrode for increasing the ratio of negative resistance to the positive resistance experienced by injected minority carriers.

2. The improvement of claim 1 wherein:

the means for forward-biasing the first junction comprises means for applying a first alternating voltage between the first and second contacts and a second alternating voltage to the control electrode;

and wherein the second voltage lags the first voltage such that the sum of the first and second voltages at the first junction lags the first voltage, whereby minority carrier injection lags the first voltage maxima.

3. The improvement of claim 2 wherein:

the control electrode is capacitively coupled to the first rectifying junction, whereby injected carriers are capacitively coupled to the first rectifying junction during an initial portion of their transit.

4. The improvement of claim 2 wherein:

that part of the semiconductor body bordered by the control electrode has a high conductivity portion and a low conductivity portion;

the low conductivity portion being adjacent the control electrode, whereby a greater part of the semiconductor electric field is near the control electrode.

5. The improvement of claim 4 wherein:

the voltage applied to the first and second contacts is sufficient to give voltage reach-through in the low conductivity portion near the control electrode, but is insufficient to give voltage reach-through in the high conductivity portion.

6. The improvement of claim 5 wherein:

part of the semiconductor body is etched in a mesa configuration;

and the control electrode is formed on a surface of the mesa.

7. The improvement of claim 5 wherein:

the high conductivity portion is biased by an auxiliary electrode such as to inhibit voltage reach-through from the first to the second contact through the high conductivity portion.

8. The improvement of claim 3 wherein:

the means for forward-biasing the first junction comprises means for applying an alternating voltage between the first and second contacts;

and wherein the length of the control electrodes is adjusted such that the injected carriers are capacitively coupled to the control electrode during a period substantially equal to $\pi/2$ radians of a cycle of said alternating voltage.

9. The improvement of claim 8 wherein:

part of the semiconductor body is etched in a mesa configuration;

and the control electrode is formed on a surface of the mesa.

10. The improvement of claim 9 wherein:

the first contact makes a first Schottky-barrier junction with the semiconductor;

the control electrode makes a second Schottky-barrier junction with the semiconductor;

and the barrier height of the second Schottky-barrier junction is higher than that of the first Schottky-barrier junction, thereby permitting selective injection across the first junction.

* * * * *